(12) United States Patent
Edwards

(10) Patent No.: US 7,743,783 B2
(45) Date of Patent: Jun. 29, 2010

(54) METHOD AND APPARATUS FOR RECYCLING PROCESS FLUIDS

(75) Inventor: David Paul Edwards, Waconia, MN (US)

(73) Assignee: Air Liquide Electronics U.S. LP, Dallas, TX (US)

( * ) Notice: Subject to any disclaimer, the term of this patent is extended or adjusted under 35 U.S.C. 154(b) by 96 days.

(21) Appl. No.: 11/732,088

(22) Filed: Apr. 2, 2007

(65) Prior Publication Data

US 2007/0235392 A1    Oct. 11, 2007

Related U.S. Application Data

(60) Provisional application No. 60/789,404, filed on Apr. 4, 2006.

(51) Int. Cl.
*G05D 11/13* (2006.01)
(52) U.S. Cl. .................. 137/2; 137/119.1; 210/739; 438/747
(58) Field of Classification Search .......... 137/2, 137/118.01, 115.25, 119.1, 5, 93; 210/739; 257/758, 762; 438/747, 957; 451/60, 446
See application file for complete search history.

(56) References Cited

U.S. PATENT DOCUMENTS

| | | | |
|---|---|---|---|
| 5,370,269 A | 12/1994 | Bernosky et al. | |
| 5,490,611 A | 2/1996 | Bernosky et al. | |
| 5,522,660 A | 6/1996 | O'Dougherty et al. | |
| 5,632,866 A | 5/1997 | Grant | |
| 5,632,960 A | 5/1997 | Ferri, Jr. et al. | |
| 5,803,599 A | 9/1998 | Ferri, Jr. et al. | |
| 5,855,792 A * | 1/1999 | Adams et al. | 210/696 |
| 5,924,794 A | 7/1999 | O'Dougherty et al. | |
| 6,026,837 A * | 2/2000 | Chen | 137/2 |
| 6,098,843 A | 8/2000 | Soberanis et al. | |
| 6,126,531 A * | 10/2000 | Iida et al. | 451/447 |
| 6,269,975 B2 | 8/2001 | Soberanis et al. | |
| 6,340,098 B2 | 1/2002 | Soberanis et al. | |
| 6,482,325 B1 * | 11/2002 | Corlett et al. | 210/662 |

(Continued)

OTHER PUBLICATIONS

Peter Singer; "The Advantages of Capping Copper With Cobalt," Semiconductor International, Oct. 1, 2005.

(Continued)

*Primary Examiner*—Stephen Hepperle
(74) *Attorney, Agent, or Firm*—Patricia E. McQueeney

(57) ABSTRACT

A method and apparatus for recycling a process fluid from a drain of a semiconductor process tool. The process fluid may be an acidic cobalt solution or an electroless cobalt solution used in a semiconductor process step to prevent electromigration in copper interconnects. The used process fluid is collected from the tool drain and recycled back to the tool inlet if a condition of the fluid is within a predetermined range. Otherwise, the used process fluid is drained from the system. The system may also operate in a bleed and feed mode where a portion of the used process fluid is periodically drained from the system.

2 Claims, 2 Drawing Sheets

U.S. PATENT DOCUMENTS

| | | | |
|---|---|---|---|
| 6,622,745 B1 * | 9/2003 | Smith et al. | 137/2 |
| 6,675,987 B2 | 1/2004 | Soberanis et al. | |
| 6,796,703 B2 | 9/2004 | Lemke | |
| 2004/0185683 A1 * | 9/2004 | Nakamura | 438/957 |
| 2005/0001324 A1 * | 1/2005 | Dunn et al. | 257/762 |
| 2005/0110149 A1 * | 5/2005 | Osaka et al. | 257/758 |
| 2005/0263488 A1 * | 12/2005 | Change et al. | 216/83 |

OTHER PUBLICATIONS http://www.reed-electronics.com/semiconductor/index.asp?layout=articlePrint&articleID=. . . ; pp. 1-5.

Neil V. Gayle, Dave Anderson; "Materials Supply Chain Management Efforts at ISMT," Semiconductor International, Mar. 1, 2003.

http://www.reed-electronics.com/semiconductor/index.asp?layout=articlePrint&articleID=. . . pp. 1-10.

* cited by examiner

US 7,743,783 B2

METHOD AND APPARATUS FOR RECYCLING PROCESS FLUIDS

CROSS-REFERENCE TO RELATED APPLICATION(S)

This application claims priority from U.S. Provisional Patent Application Ser. No. 60/789,404 filed Apr. 4, 2006.

FIELD OF THE INVENTION

The present invention is directed to a method and apparatus for recycling a process fluid from a semiconductor process tool. More particularly, the invention is directed to a method and apparatus for recycling or draining a used process fluid from a semiconductor process tool based upon a condition of the used process fluid.

BACKGROUND OF THE INVENTION

The manufacture of semiconductor devices is a complex process that can involve over 200 process steps. Each step requires optimal conditions to ultimately result in a high yield of semiconductor devices. Many process steps require the use of fluids to inter alia etch, clean, expose, coat, and polish the surface layers of the devices during manufacturing. In high purity fluid applications, the fluids (e.g. hydrofluoric acid, sulfuric acid, ammonium hydroxide, hydrogen peroxide, etc.) must be substantially free of particulate and metal contaminants in order to prevent defects in the finished devices. In chemical-mechanical polishing slurry applications, the slurries (e.g. Semi-Sperse®-12, iCue® 5001, Klebosole® 1501, Cab-O-Sperse® SC-112, etc.) must be free from large particles capable of scratching the surfaces of the devices. Moreover, during manufacturing there must be a stable and sufficient supply of the fluids to the process tools carrying out the various steps to minimize process variability and manufacturing downtime.

As semiconductor manufacturers design new devices in-line with the International Technology Roadmap for Semiconductors (ITRS) to produce smaller, faster and more reliable devices, new manufacturing challenges arise. Solutions to these challenges often require the use of novel or non-traditional fluids in the manufacturing process. An example of such a challenge is electromigration in copper interconnects. Electromigration occurs when electrons push and move the metal atoms in the direction of current flow at a rate determined by the current density. Electromigration can lead to thinning of the interconnect, high resistivity, or a line break. (see P. Singer, "The Advantages of Capping Copper with Cobalt," *Semiconductor International, October* 2005).

There are two known methods for eliminating electromigration in copper interconnects. One method is to form a cap on the interconnect by first depositing a palladium activation layer over the surface of the copper and then introducing an electroless cobalt solution to react with the palladium and form an electroless cobalt tungsten phosphide (CoWP) layer on the palladium. Another method is to use a self-activating process, which would not require deposition of palladium. In this process, a complex and unstable deposition fluid containing inter alia cobalt and acid is applied directly to the copper to form a cobalt cap layer on the copper. (see P. Singer, "The Advantages of Capping Copper with Cobalt," *Semiconductor International*, October 2005). While these processes show promise to solve the problem of electromigration in copper interconnects, the cobalt solutions they employ are expensive particularly when such solutions are discarded after every use.

Semiconductor manufacturers historically have been reluctant to reclaim and recycle semiconductor process fluids primarily due to concern of contamination in the recycled fluids resulting from particles, metals and/or degradation of the fluid. Moreover, some fluids require a complex series of operations to be performed (e.g. distillation, adsorption, carbon filtration, etc.) before they are ready for reuse by a semiconductor tool. It may be that reclaim and recycle equipment costs and potential manufacturing downtime resulting from out of spec recycled fluid, have outweighed the gain of reclaiming and recycling the process fluids. However, with the emerging use of costly non-traditional solutions (e.g. the cobalt solutions mentioned above), there is a need for methods and apparatus for reclaiming and recycling semiconductor process fluids.

BRIEF SUMMARY OF THE INVENTION

In one aspect, the invention provides a method of recycling a process fluid comprising the steps of: reclaiming used process fluid from a drain of a semiconductor process tool wherein the used process fluid flows from the drain and into a reclaim line; measuring a condition of the used process fluid with a fluid sensor connected to the reclaim line; sending a signal indicative of the condition from the fluid sensor to a controller and determining if the signal is within a predetermined range; and recycling the used process fluid to the semiconductor process tool if the signal is within the predetermined range or diverting at least a portion of the used process fluid to a system drain if the signal is outside of the predetermined range.

In another aspect, the invention provides an apparatus for recycling a process fluid from a semiconductor process tool comprising: a reclaim line connected to a drain of the semiconductor process tool for reclaiming used process fluid; a fluid sensor connected to the reclaim line for measuring a condition of the used process fluid; a recycle line for recycling the used process fluid from the reclaim line to an inlet of the semiconductor process tool; a tank positioned in the recycle line, the tank having an inlet for receiving the used process fluid from the reclaim line; a controller adapted to receive a signal indicative of the condition from the fluid sensor and to determine if the signal is within a predetermined range wherein if the signal is within the setpoint range the controller is adapted to send a signal to a valve to direct the used process fluid to the tank and if the signal is outside of the setpoint range the controller is adapted to send a signal to the valve to direct the used process fluid to the system drain; and a fluid distribution means connected to the tank and to the inlet of the semiconductor process tool.

In another aspect, the invention is directed to a system for recycling an acidic cobalt solution comprising: a semiconductor process tool adapted to prevent electromigration in copper interconnects by applying the acidic cobalt solution to the copper interconnects; and a recycling system comprising: a reclaim line connected to a drain of the semiconductor process tool for reclaiming used acidic cobalt solution; a conductivity probe connected to the reclaim line for measuring conductivity of the used acidic cobalt solution; a recycle line for recycling the used acidic cobalt solution from the reclaim line to an inlet of the semiconductor process tool; a tank positioned in the recycle line, the tank having an inlet for receiving the used acidic cobalt solution from the reclaim line; a controller adapted to receive a signal indicative of the conductivity and to determine if the signal is within a predetermined conductivity range wherein if the signal is within the conductivity range the controller is adapted to send a signal to a valve to direct the used acidic cobalt solution to the tank and if the signal is outside of the conductivity range the controller is adapted to send a signal to the valve to direct the used acidic cobalt solution to the system drain; and a fluid distribution means connected to the tank and to the inlet of the semiconductor process tool.

DETAILED DESCRIPTION OF THE INVENTION

Figure 1:
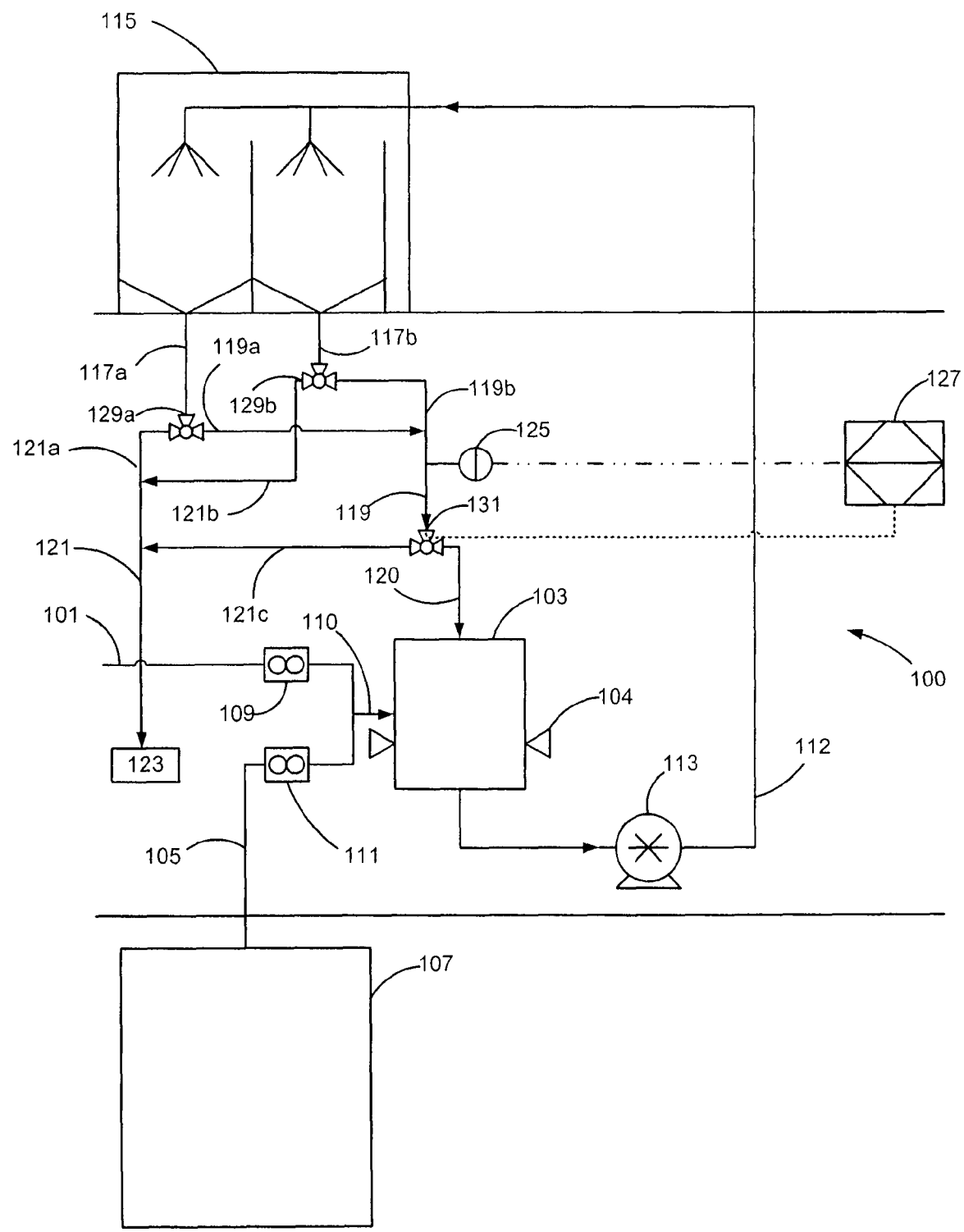
FIG. 1 is a schematic representation of one embodiment of the present invention.
Figure 2:
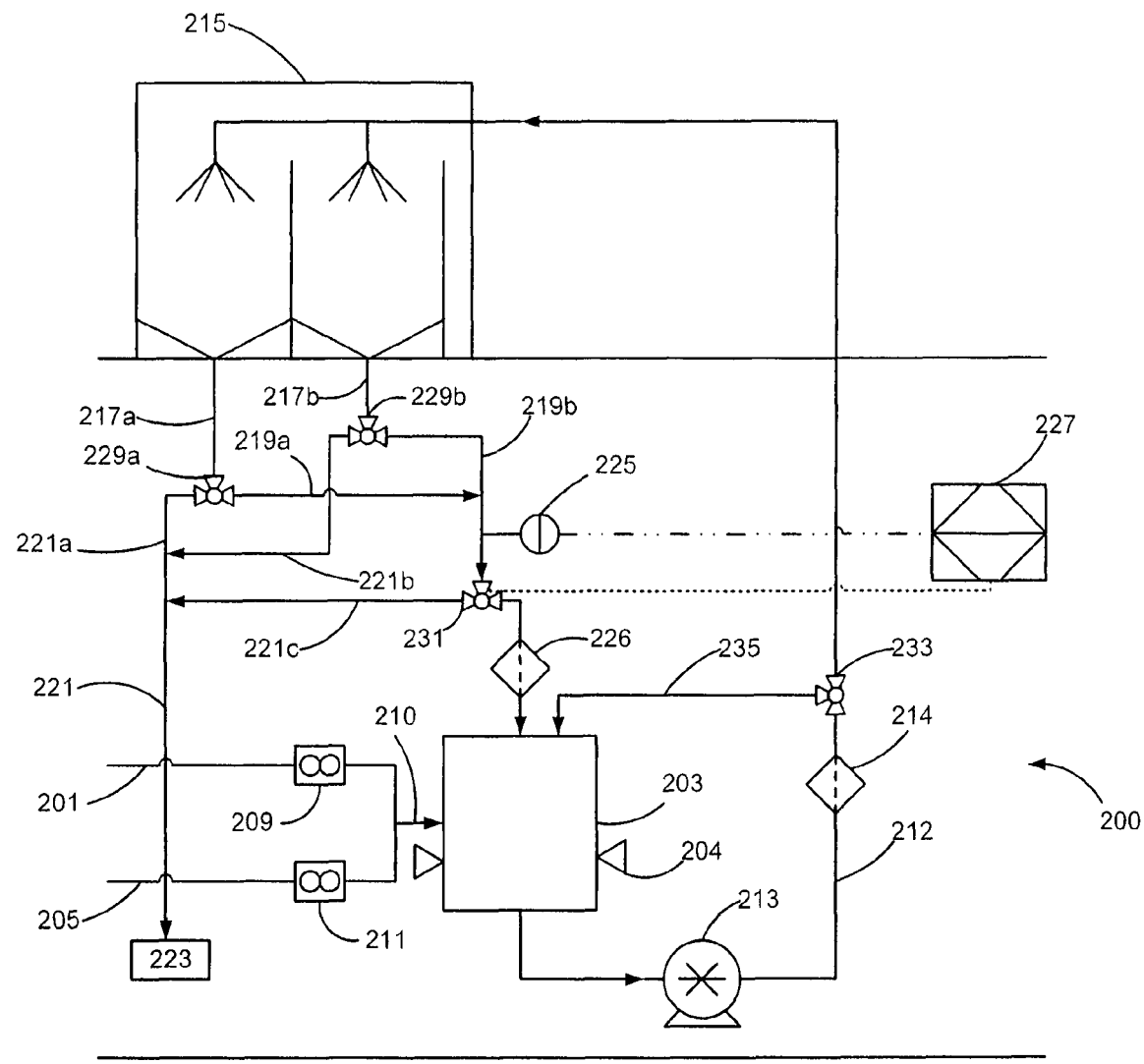
FIG. 2 is a schematic representation of another embodiment of the present invention.

Embodiments of the present invention are shown in FIGS. 1 and 2. The invention is directed to a system for recycling a used process fluid reclaimed from a drain of a semiconductor process tool. The reclaimed process fluid is either recycled back to an inlet of the process tool if a condition of the used process fluid is within a predetermined range or drained from the system. In one embodiment, the invention provides a blending and distribution and recycle and reclaim system that supplies used process fluid to a point of use (e.g. a semiconductor process tool). More specifically, the invention provides an apparatus and method for blending at least two fluids to form a semiconductor process fluid, distributing the mixture to a semiconductor process tool at a sufficient pressure for semiconductor processing, reclaiming the mixture and, based upon certain parameters, either recycling or draining the mixture.

FIG. 1 shows an embodiment of the recycling system 100 according to the present invention. Used process fluid exits the tool 115 through one or more drain lines 117a and 117b. The fluid may exit the tool by gravity, or the tool 115 may include a sump pump for transferring used process fluid into the one or more drain lines 117a and 117b. As shown in FIG. 1, each drain line splits into two separate flow paths 119 and 121 at valves 129a and 129b. Alternatively, the drain lines 117a and 117b may tee together and in this configuration, only one valve (129a or 129b) would be used; operation of the system would be substantially the same as the two valve configuration. The used process fluid is reclaimed by flowing through flow path 119 ("the reclaim line") and back into tank 103. However, if certain conditions exist (as will be further discussed below), the used process fluid will be diverted to drain line 121 to flow into a drain system 123 such as an acid-base neutralization system. The three-way valves 129a and 129b may be used to selectively divert the flow of used process fluid through either the reclaim line 119 or the drain line 121.

As shown in FIG. 1, the reclaim line 119 includes a sensor 125 to monitor a condition of the used process fluid in the reclaim line 119. Alternatively, a sensor may be placed in each drain line 117a and 117b upstream of valves 129a and 129b. The sensor 125 is preferably a conductivity probe that monitors the conductivity of the used process fluid. However, other sensors may also be used such as a pH probe, an ORP probe, a densitometer, an autotitrator or a refractive index sensor. Notably, a combination of sensors may be installed in reclaim line 119 (or drain lines 117a and 117b) to monitor the used process fluid; for example, a conductivity probe and densitometer may be installed in reclaim line 119 (or drain lines 117a and 117b). Sensor 125 may be electrically or wirelessly connected to a controller 127 (e.g. a programmable logic controller) which monitors the signal output from sensor 125. Controller 127 may also be either electrically, wirelessly, or pneumatically connected to the other components of the system including the flow controllers 109, 111, the pump 113, and the valves 129a, 129b, 131.

A pump 113 (e.g. a reciprocating pump, a positive displacement pump, a bellows pump, a centrifugal pump, etc.) may be positioned in the recycle line 112 to draw the process fluid from tank 103 and deliver the process fluid at a specified pressure to the semiconductor process tool 115. Notably, the process fluid in the tank may be a mixture of used process fluid from the drain lines 117 and fresh process fluid from line 110. Tool 115 may include one or more spray heads and the recycle line 112 of system 100 can be configured to supply one or more tools. The pressure requirements of such tools range from about 5 to about 60 psi.

When the fluid level in the tank 103 is low, a first flow controller 109 supplies a first fluid and a second flow controller 111 supplies a second fluid to the tank 103. The first flow controller 109 is connected to first fluid supply line 101 while the second flow controller 111 is connected to second fluid supply line 105. The first fluid may be pressurized deionized water, for example, supplied by an on-site water purification plant. The first fluid may also be ammonium hydroxide, hydrogen peroxide, or an additive or diluent supplied by any pressurized source. The second fluid may be any fluid used for a process step in a semiconductor spray-head tool. The second fluid may be, for example, an acidic cobalt solution supplied by a bulk fluid blending and/or distribution system 107 such as those manufactured by the BOC Edwards™, Inc. Chemical Management Division (Chanhassen, Minn.). The second fluid may also be hydrofluoric acid, sulfuric acid, ammonium hydroxide, hydrogen peroxide or the like, or Semi-Sperse-12 ("SS-12"), iCue 5001, Klebosol 1501 ("K-1501"), Cab-O-Sperse SC-112 ("SC-112") or other like fluids.

The first and second fluids may be blended together using one of several blending techniques including weight-based blending, volumetric-based blending and flow controller blending. Examples of weight-based blending are described in U.S. Pat. Nos. 6,098,843; 6,269,975; 6,340,098 and 6,675,987. Examples of volumetric-based blending are described in U.S. Pat. Nos. 5,632,960; 5,370,269; 5,490,611 and 5,803,599. FIG. 1 shows an embodiment of the invention using flow controller blending; however, it should be noted that the above-listed weight-based or volumetric-based blending techniques may be substituted for the flow controller blending technique described herein. FIG. 1 shows that the flow rates of the first and second fluids are controlled by flow controllers 109 and 111, respectively. Examples of suitable flow controllers include the LiquiSys™ manufactured by BOC Edwards, Inc. or other flow controllers manufactured by NT International, PLC or Entegris®, Inc. The flow rates of each fluid may also be controlled by peristaltic pumps, metering valves, totalizing flow meters, or the like. Tank 103 is preferably constructed of an inert wetted material such as perfluoroalkoxy (PFA), polytetrafluoroethylene (PTFE), polyvinylchloride (PVC), polyvinylidine difluoride (PVDF), or polyethylene (PE), for example, and can include one or more level sensors 104 such as capacitive, optical, or digital sensors or load cells.

During operation system 100 forms a mixture of the first fluid and the second fluid by controlling the flow rates of each fluid with flow controllers 109 and 111. For example, the second fluid may be a concentrated acidic cobalt solution that requires dilution to 10% with deionized water (i.e. the first fluid in this example) prior to semiconductor processing in the tool 115. Accordingly, flow controller 111 may control the flow rate of the cobalt solution at 10 ml/min while flow controller 109 controls the flow rate of the deionized water at 100 ml/min in order to achieve the desired concentration or mix ratio. Notably, the rate of blending should exceed the rate of pumping so that fluid mixture is available for the tool 115 at all times. Thus, the flow rates of the first and second fluids may be increased or decreased depending upon the flow rate demand of the tool 115.

In a preferred embodiment, as shown in FIG. 1, fluid lines 101 and 105 are connected upstream of tank 103 so that the first and second fluid are already combined when entering tank 103 rather than entering the tank as individual components. System 100 may include a mixing device, such as an in-line static mixture, downstream of the tee to ensure that there is sufficient mixing of the two fluids prior to entering tank 103. In another embodiment, the fluid lines 101 and 105 may be individually connected to tank 103 and mixing of the fluids would then occur in the tank through a mixing device, like a stirrer, or through turbulence.

Moreover, another sensor (e.g. conductivity probe, pH probe, ORP probe, autotitrator or refractive index sensor) may be configured to monitor a characteristic of the fluid mixture in tank 103 and transmit a signal to controller 127. For example, if an autotitrator is used, a pump may periodically draw a sample from tank 103 (or from a point just downstream from tank 103 or pump 112) into the autotitrator. The autotitrator would then perform a titration on the sample to determine the concentration of a component (e.g. hydrogen peroxide) in the fluid mixture. If the concentration of the component is outside of a predetermined range, then controller 127 would activate the flow controller (109 or 111) on the supply line (101 or 105) for that component to add an additional volume of that component to the fluid mixture. The system 100 may also be configured so that the controller 127 sends a signal to another device for dosing the component into tank 103 from a pressurized line other than supply lines 101 or 105. In this configuration, the pressurized line may be fed by a blending and/or distribution system or by a small dosing or metering pump drawing fluid from a drum.

System 100 may also include level sensors 104 to ensure that tank 103 maintains a sufficient volume of fluid mixture in the tank 103 and to prevent overfill or overpressurization of the tank 103. For example, tank 103 may include four capacitive sensors to monitor low-low, low, high and high-high levels of the tank. During operation, the fluid mixture is withdrawn from tank 103 by pump 113 and the tank is refilled from one of two sources. Tank 103 may receive fresh fluid mixture from line 110 or used process fluid from line 120. As will be further discussed below, used process fluid will normally flow through reclaim line 119 and back into tank 103. However, used process fluid will also be periodically bled from system 100 through drain line 121. Thus, the fluid level in tank 103 will decrease over time. When the fluid level in tank 103 reaches a low set point (e.g. determined by a low sensor or a predetermined weight), the controller 127 will activate the flow controllers 109 and 111 to refill tank 103 with fresh fluid mixture to a high set point (e.g. determined by a high sensor or a predetermined weight).

In one embodiment, the pump 113 withdraws the fluid mixture from tank 103 and dispenses it to one or more points of use, such as semiconductor process tool 115, at a predetermined pressure (e.g. typically about 5 to about 60 psi). After processing, the used process fluid flows through the tool drain line 117a or 117b. If the system 100 is operating in a reclaim mode, the fluid flows through the normally open port of valve 129a or 129b and past sensor 125. Sensor 125 monitors a condition (e.g. conductivity, pH, etc.) of the used process fluid and sends a signal to controller 127. If the signal is within a predetermined range, then the controller will maintain valve 131 in its normally open position thereby permitting the used process fluid to flow into tank 103. However, if the signal is outside the predetermined range, then the used process fluid is diverted to drain line 121 and to the manufacturing plant's drain system. If the fluid is reclaimed, it flows into tank 103 and combines with a mixture of fresh blended and/or pre-used fluid. This mixture is then recycled through the pump 113 and back to the tool 115 for further processing.

If the system 100 is operating in a drain mode, the used process fluid will flow through drain line 117a or 117b and through the normally closed ports of valves 129a or 129b into drain system 123. This mode may be useful if a tool operator desires to drain the system 100 and remove all reclaimed fluid. In addition, system 100 may enter the drain mode when the level of the fluid mixture in tank 103 reaches the high level thereby making tank 103 unable to accept more fluid.

System 100 may also operate in a bleed and feed mode. During this mode, controller 127 may be configured to activate one or more of valves 129a, 129b or 131 at periodic time intervals. For example, the controller may be configured to activate valves 129a and 129b every 5 minutes for a period of 30 seconds thereby diverting a portion of the used process fluid to drain 123. Similarly, the controller 127 may be configured to periodically activate valve 131 to bleed used process fluid from system 100. System 100 may also be configured to have a mechanical bleed and feed. For example, in FIG. 1, a slipstream line (e.g. a ¼ inch tube) may be installed downstream from valve 131 and the slipstream line would tee into drain line 121. The slipstream line may include an orifice (e.g. 0.100 inch orifice) which would permit a portion of the used process fluid to continuously flow to the drain system 123. In addition, the bleed and feed operation may also be based upon the signal received from sensor 125 such that if a measured condition of the fluid (measured by sensor 125) is outside of a predetermined range, the controller 127 will activate valve 131 (or valves 129a and 129b) to divert used process fluid to the drain system 123 for a predetermined period of time or until the measured condition is back within the predetermined range.

System 100 may operate in an on-line or on-demand mode. When operating in an on-line mode, the pump continuously supplies the fluid mixture from tank 103 to the one or more points of use and continuously reclaims or drains the used process fluid using one of the above described modes: the reclaim mode, the drain mode and/or the bleed and feed modes. In an on-demand mode, the controller 127 is configured to receive a demand signal from the one or more points of use and activate the pump 113 to supply fluid mixture to a point of use upon receipt of the demand signal.

It should be noted that system 100 is user configurable. The controller 127 may include a human machine interface (HMI) which would permit a user or operator to select the desired modes of operation.

Another embodiment of the present invention is shown in FIG. 2. Used process fluid exits tool 215 through one or more drain lines 217a and 217b. The fluid may enter drain lines 217a and 217b by gravity or tool 215 may include one or more sump pumps for transferring the used process fluid into the drain lines 217a and 217b. In the embodiment shown in FIG. 2, drain lines 217a and 217b split into two flow paths 219 and 221 at valves 229a and 229b. Alternatively, drain lines 217a and 217b may tee in and in this configuration, only one valve (229a or 229b) would be used; operation of system 200 would be substantially the same as the two valve configuration. The used process fluid can be reclaimed by flowing through flow path 219 ("the reclaim line") and back into tank 203. However, if certain conditions exist, the used fluid is diverted to drain line 221 to flow into a drain system 223 such as an acid-base neutralization system. Three-way valves 229a and 229b may be used to selectively divert the used process fluid through either the reclaim line 219 or the drain line 221. Another filter 226 may be installed in the reclaim line 219 to filter out any particles resulting from processing or from flow through process tool 215.

A sensor 225 is installed in reclaim line 219 and monitors a condition of the used process fluid in the line 219. Alternatively, a sensor may be installed in each drain line 217a and 217b upstream of valves 229a and 229b. Sensor 225 is preferably a conductivity probe, but could also be a pH probe, an ORP probe, a densitometer, an autotitrator or a refractive index sensor. Notably, numerous sensors may be installed in reclaim line 219 to monitor the condition of the fluid; for example, a conductivity probe and a densitometer may be installed in the reclaim line 219. Sensor 225 may be electrically or wirelessly connected to a controller 227 (e.g. a programmable logic controller) which monitors an output signal from sensor 225. Controller 227 may also be electrically, wirelessly, or pneumatically connected to the other components of the system including the flow controllers 209, 211, the pump 213, and the valves 229a, 229b, 231 and 233.

System 200 includes a pump 213 (e.g. a reciprocating pump, a positive displacement pump, a bellows pump, a centrifugal pump, etc.) for drawing fluid from tank 203 and delivering the fluid at a predetermined pressure (e.g. between about 5 and about 60 psi) to one or more points of use such as a semiconductor process tool 215. Notably, tool 215 may include one or more spray heads and the pump distribution line 212 of system 200 can be configured to supply one or more tools. A filter 214 may be installed in pump distribution line 212 to filter the fluid mixture prior to processing.

First and second fluid supply lines 201 and 205 respectively supply first and second fluids to tank 203. The first fluid (e.g. pressurized deionized water, ammonium hydroxide, hydrogen peroxide, any additive, any diluent, etc.) may be supplied by an on-site plant, or by any pressurized source. The second fluid (e.g. an acidic cobalt solution, hydrofluoric acid, sulfuric acid, ammonium hydroxide, hydrogen peroxide or the like, or SS-12, iCue 5001, K-1501, SC-112 or other like fluids) may be supplied by a bulk fluid blending and/or distribution system or by any pressurized source.

As mentioned above with respect to the first embodiment, the first and second fluids may be blended using weight-based blending, volumetric-based blending or flow controller blending. While any one of these techniques may be employed in system 200, FIG. 2 shows an embodiment of the invention using flow controller blending. Flow controllers 209 and 211 are installed in supply lines 201 and 205, respectively, to control the flow rates of the first and second fluids. However, as mentioned above with respect to system 100, peristaltic pumps, metering valves, totalizing flow meters or the like may be used instead of flow controllers. Tank 203 is preferably constructed of an inert wetted material (e.g. PFA, PTFE, PVC, PVDF, or PE), and can include one or more level sensors 204 such as capacitive, optical, or digital sensors or load cells.

During operation system 200 forms a mixture of the first and second fluids by controlling the flow rates of each fluid with flow controllers 209 and 211. For example, the second fluid (e.g. a concentrated acidic cobalt solution) may require dilution with the first fluid (e.g. deionized water) to about 10% prior to semiconductor processing in the tool 215. Thus, flow controller 211 could control the flow rate of the second fluid at 10 ml/min while flow controller 209 controls the flow rate of the first fluid at 100 ml/min in order to achieve the desired concentration or mix ratio. Notably, the rate of blending should exceed the rate of pumping so that the fluid mixture is available for the tools at all times. Thus, the flow rates of the first and second fluids may be increased or decreased depending upon the flow rate demand of the tool 215.

In a preferred embodiment, as shown in FIG. 2, fluid lines 201 and 205 are connected upstream of tank 203 so that the first and second fluid are combined prior to entering tank 203. System 200 may include a mixing device, such as an in-line static mixture, downstream of the tee to ensure that there is sufficient mixing of the two fluids prior to entering tank 203. In another embodiment, the fluid lines 201 and 205 may be individually connected to tank 203 so that mixing of the fluids would occur in the tank through a mixing device, like a stirrer, or through turbulence.

Moreover, another sensor (e.g. conductivity probe, pH probe, ORP probe, autotitrator or refractive index sensor) may be configured to monitor a characteristic of the fluid mixture inside of tank 203 and transmit a signal to controller 227. For example, if an autotitrator is used, a pump may periodically draw a sample from tank 203 (or from a point just downstream from tank 203 or pump 213) into the autotitrator. The autotitrator would then perform a titration on the sample to determine the concentration of a component (e.g. hydrogen peroxide) in the fluid mixture. If the concentration of the component is outside of a predetermined range, then controller 227 would activate the flow controller (i.e. 209 or 211) on the supply line (i.e. 201 or 205) for that component to add an additional volume of that component to the fluid mixture. The controller 227 may also be configured to send a signal to another device for dosing the desired component into tank 203 from a pressurized line other than supply lines 201 or 205. In this configuration, the pressurized line may be fed by a blending and/or distribution system or by a small dosing or metering pump drawing fluid from a drum.

Tank 203 may include level sensors 204 for ensuring that the tank maintains a sufficient volume of fluid mixture and to prevent overfill or overpressurization of the tank 203. For example, tank 203 may include two load cells for measuring a low weight and a high weight. During operation, the fluid mixture is withdrawn from tank 203 by pump 213 and the tank is refilled from one of three sources. Tank 203 may receive fresh fluid mixture from line 210, used process fluid from line 220, or recirculated fluid mixture from line 235. As will be further discussed below, used process fluid will normally flow through reclaim line 219 and back into tank 203. However, used process fluid will also be periodically bled from system 200 through drain line 221. Thus, the fluid level in tank 203 will decrease over time. When the fluid level in tank 203 reaches a low set point (e.g. determined by a low sensor or a predetermined weight), the controller 227 will activate the flow controllers 209 and 211 to refill tank 203 with fresh fluid mixture to a high set point (e.g. determined by a high sensor or a predetermined weight).

During operation pump 213 withdraws the fluid mixture from tank 203 and dispenses it at a predetermined pressure (e.g. typically about 5 to about 60 psi) to one or more points of use, such as semiconductor process tool 215. Used process fluid flows through one or both drain lines 217a and 217b and to respective valves 229a and 229b. If system 200 operates in a reclaim mode, the used process fluid flows through the normally open port of valve 229a or 229b and past sensor 225. Sensor 225 monitors a condition of the used process fluid and sends a signal to controller 227. If the signal is within a predetermined range, then the controller maintains valve 231 in its normally open position thereby permitting the used process fluid to flow into tank 203. However, if the signal is outside the predetermined range, then the used process fluid is diverted to drain line 221 and to the manufacturing plant's waste neutralization system. If the used process fluid is reclaimed, it flows into tank 203 and combines with a mixture of fresh blended and/or pre-used fluid. This mixture is then recycled through pump 213 and back to tool 215 for further processing.

If the system is operating in a drain mode, the used process fluid will flow through drain line 217a or 217b and through the normally closed ports of valves 229a or 229b into drain system 123. This mode may be useful if a tool operator desires to drain the system 200 and remove all reclaimed fluid. In addition, system 200 may enter the drain mode when the level of the fluid mixture in tank 203 reaches the high level thereby making tank 203 unable to accept more fluid.

System 200 may also operate in a bleed and feed mode. During this mode, controller 227 may be configured to activate one or more of valves 229a, 229b or 231 at periodic time intervals. For example, the controller may be configured to activate valves 229a and 229b every 5 minutes for a period of 30 seconds thereby diverting a portion of the used process fluid to drain 223. System 200 may also be configured to have a mechanical bleed and feed. For example, a slipstream line (e.g. a ¼ inch tube) may be installed downstream from valve 231 and the slipstream line would tee into drain line 221. The slipstream line may include an orifice (e.g. 0.013" orifice) which would permit a portion of the used process fluid to continuously flow to the drain system 223. In addition, the bleed and feed operation may also be based upon the signal received from sensor 225 such that if a measured condition of the fluid (measured by sensor 225) is outside of a predetermined range, the controller 227 will activate valve 231 (or valves 229a and 229b) to divert used process fluid to the drain system 223 for a predetermined period of time or until the measured condition is back within the predetermined range.

System 200 operates in an on-line mode such that the pump 213 operates continuously to either supply the fluid mixture from tank 203 to one or more points of use or to recirculate the fluid mixture back to the tank 203. When the controller 227 receives a demand signal from a point of use, the controller 227 activates valve 233 so that the fluid mixture flows through the normally closed port of valve 233 and to the point of use. Simultaneously, the system 200 either reclaims or drains the used process fluid using one of the above described modes: the reclaim mode, the drain mode and/or the bleed and feed modes. When there is no tool demand, valve 233 is deactivated and the fluid flows through the normally open port of valve 233 and back into tank 203. Recirculation back to tank 203 ensures optimal performance of filter 214 to maintain the concentration of particles at a low level.

Like system 100, system 200 is user configurable. The controller 227 may include a human machine interface (HMI) which would permit a user or operator to select the desired modes of operation.

Notably, in alternative embodiments, systems 100 and 200 may include two tanks. While one tank is in an on-line mode and either recirculating or dispensing the fluid mixture, the other tank would be in a blend and qualification mode. During the blend and qualification mode, the controller 127 or 227 would initiate a blend sequence to fill the off-line tank and then initiate a qualifying sequence including measuring a condition of the fluid mixture in the off-line tank with a conductivity probe, a pH probe, an ORP probe, an autotitrator or a refractive index sensor. If the condition was outside a predetermined range, the controller 127 or 227 would activate one of the flow controllers (109, 111 or 209, 211) or another pressurized source to add additional fluid to the off-line tank, and then the controller 127 or 227 would re-measure the condition of the fluid in the off-line tank. The controller 127 or 227 may also be configured to give an error message when the off-line tank is out of specification. Once qualified, the off-line tank would wait idle until the level of the fluid in the on-line tank reaches its low level and then the tanks would switch operational modes.

Moreover, although the use of filters has only been described with respect to system 200, filters could also be installed in the embodiment of the invention shown in FIG. 1. Moreover, while both embodiments were described as blending two fluids supplied by pressurized lines 101 and 105 or 201 and 205, either system 100 or 200 can be configured to blend two or more pressurized fluids supplied by two or more supply lines either upstream of tanks 103 or 203 or in tanks 103 or 203. In addition, either system 100 or system 200 may further include a system drain line in the pump distribution lines 112 or 212. In this configuration, a three-way valve would be installed in the recycle line 112 or 212 and the controller 127 or 227 would periodically activate this valve to bleed fluid mixture from the system 100 or 200 to the drain system 123 or 223.

Furthermore, it should be noted that systems 100 and 200 may be located on a different level of the semiconductor manufacturing plant than the tool 115 or 215 or the fluid blending and/or distribution systems 107. For example, a fluid distribution system may be located in the basement and may supply pressurized fluid to system 100 or 200 which is located on a level above the basement in the "sub-fab." In addition, the tool may be located above system 100 or 200 in the "fab."

The present invention as described above and shown in the embodiments of FIGS. 1 and 2 provides a cost effective solution for recycling semiconductor process fluids. The invention further provides a system for blending and distribution and reclaiming and recycling a semiconductor process fluid. It is anticipated that other embodiments and variations of the present invention will become readily apparent to the skilled artisan in light of the foregoing description and examples, and it is intended that such embodiments and variations likewise be included within the scope of the invention as set forth in the following claims.

I claim:

1. A method of recycling an acidic cobalt solution from a semiconductor process tool comprising the steps of:
reclaiming used acidic cobalt solution from a drain of the semiconductor process tool wherein the used acidic cobalt solution flows from the drain and into a reclaim line;
measuring conductivity of the used acidic cobalt solution with a conductivity probe connected to the reclaim line;
sending a signal indicative of the conductivity to a controller and determining if the conductivity is within a predetermined conductivity range;
recycling the used acidic cobalt solution to the semiconductor process tool if the conductivity is within the predetermined conductivity range and diverting at least a portion of the used acidic cobalt solution to a system drain if the conductivity is outside of the predetermined conductivity range wherein the step of recycling the used acidic cobalt solution comprises transferring the used acidic cobalt solution to a tank and pumping the acidic cobalt solution from the tank to an inlet of the semiconductor process tool; and adding fresh acidic cobalt solution to the tank when the level of the acidic cobalt solution in the tank reaches a low setpoint;

wherein the step of adding fresh acidic cobalt solution to the tank comprises combining a first fluid with a second fluid to form the fresh acidic cobalt solution; and wherein the step of combining the first and second fluids comprises controlling the flow rate of the first fluid with a first flow controller and controlling the flow rate of the second fluid with a second flow controller.

2. A system for recycling an acidic cobalt solution comprising:

a semiconductor process tool adapted to prevent electromigration in copper interconnects by applying the acidic cobalt solution to the copper interconnects; and a recycling system comprising:

a reclaim line connected to a drain of the semiconductor process tool for reclaiming used acidic cobalt solution;

a conductivity probe connected to the reclaim line for measuring conductivity of the used acidic cobalt solution;

a recycle line for recycling the used acidic cobalt solution from the reclaim line to an inlet of the semiconductor process tool;

a tank positioned in the recycle line, the tank having an inlet for receiving the used acidic cobalt solution from the reclaim line;

a controller adapted to receive a signal indicative of the conductivity and to determine if the signal is within a predetermined conductivity range wherein if the signal is within the conductivity range the controller is adapted to send a signal to a valve to direct the used acidic cobalt solution to the tank and if the signal is outside of the conductivity range the controller is adapted to send a signal to the valve to direct the used acidic cobalt solution to the system drain;

a fluid distribution means connected to the tank and to the inlet of the semiconductor process tool; and a first flow controller for controlling the flow rate of a first fluid and a second flow controller for controlling the flow rate of a second fluid wherein the first and second fluids are adapted to combine to form a stream of fresh acidic cobalt solution and wherein the tank includes a fluid inlet for the stream of fresh acidic cobalt solution.

* * * * *